(12) United States Patent
Kutsuzawa et al.

(10) Patent No.: US 8,157,974 B2
(45) Date of Patent: Apr. 17, 2012

(54) MAGNET UNIT FOR MAGNETRON SPUTTERING SYSTEM

(75) Inventors: Tomoko Kutsuzawa, Kawasaki (JP); Akihiko Fujisaki, Kawasaki (JP); Tetsuyuki Kubota, Kawasaki (JP); Atsushi Furuya, Kawasaki (JP); Nobuyoshi Yamaoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 455 days.

(21) Appl. No.: 12/392,747

(22) Filed: Feb. 25, 2009

(65) Prior Publication Data

US 2009/0218218 A1  Sep. 3, 2009

(30) Foreign Application Priority Data

Feb. 29, 2008  (JP) .................... 2008-050954

(51) Int. Cl.
*C23C 14/00*  (2006.01)
(52) U.S. Cl. .................................. 204/298.16
(58) Field of Classification Search ............. 204/298.16; 29/426.1
See application file for complete search history.

(56) References Cited

U.S. PATENT DOCUMENTS

2007/0209927 A1* 9/2007 Kamei et al. ............... 204/192.1

FOREIGN PATENT DOCUMENTS

| JP | 62-060866 | 3/1987 |
|---|---|---|
| JP | B2 2575069 | 7/1992 |
| JP | A 5-69158 | 3/1993 |
| JP | A 6-93442 | 4/1994 |
| JP | A 9-118980 | 5/1997 |
| JP | 10-317137 | 12/1998 |
| WO | WO 2006/082863 A1 | 8/2006 |

OTHER PUBLICATIONS

Office action issued by the Japanese Patent Office in corresponding App. No. 2008-050954, dated Feb. 14, 2012 (partial translation; p. 2 line 3-p. 11).

* cited by examiner

*Primary Examiner* — Stephen Rosasco
(74) *Attorney, Agent, or Firm* — Greer, Burns & Crain, Ltd.

(57) ABSTRACT

A magnet unit for a magnetron sputtering system includes a base plate and a plurality of magnet parts each including a first magnet and a first supporting member. The first supporting member supports the first magnet and fixes the first magnet to the base plate. The magnet parts confine a plasma.

10 Claims, 9 Drawing Sheets

MAGNET UNIT FOR MAGNETRON SPUTTERING SYSTEM

CROSS-REFERENCE TO APPLICATION

This application is based upon and claims the benefit of priority to Japanese Patent Application No. 2008-50954, filed on Feb. 29, 2008, the entire contents of which are incorporated herein by reference.

BACKGROUND

1. Field

An aspect of the invention relates to a magnet unit for a magnetron sputtering system.

2. Description of the Related Art

A magnetron sputtering system has generally been used to form various thin films on a substrate, such as a semiconductor substrate. The magnetron sputtering system performs sputtering using plasma while generating a magnetic field in the vicinity of the surface of a target, which is a sputtering material. A rotary magnet cathode is used to effectively utilize a target and form a uniform thin film by sputtering the target. The rotary magnet cathode is a device that rotates a plurality of permanent magnets on the rear surface of the target to rotate a magnetic field having a predetermined pattern in the vicinity of the front surface of the target. In order to generate the magnetic field having a predetermined pattern, a magnet unit formed by arranging a plurality of permanent magnets in a predetermined pattern is used.

The plurality of permanent magnets are arranged in a predetermined pattern such that the target is effectively sputtered. In the same arrangement of the magnets, the sputtering speed of the target or the deposition rate of the target on the substrate depends on the process conditions or the kind of target used during sputtering. Therefore, in this case, the arrangement of the magnets according to the process conditions or the kind of target can be changed. In order to change the arrangement of the magnets, some or all of the permanent magnets provided in the magnet unit can be removed, and the positions where the permanent magnets are attached changed. Hereinafter, the magnet unit to which the permanent magnet is detachably attached is referred to as a detachable magnet unit.

In many cases, a magnet unit according to the related art includes a base plate to which the permanent magnets are fixed. The base plate is formed of a magnetic material, and serves as a yoke through which magnetic flux generated from the permanent magnet passes.

Therefore, a detachable magnet unit has been proposed in which a groove is formed in a base plate, serving as a yoke, and the yoke having the permanent magnet attached thereto is fitted into the groove of the base plate and then screwed to the base plate such that it can be detached from the base plate (for example, see Patent Document 1).

Further, a detachable magnet unit has been proposed in which a pair of permanent magnets are fixed to a yoke member to form a detachable magnet part, and a plurality of detachable magnet parts are screwed to a base plate (for example, see Patent Document 2).

Patent Document 1

Japanese Laid-open Patent Publication No. 6-93442

Patent Document 2

Japanese Laid-open Patent Publication No. 9-118980

In the above-mentioned detachable magnet units, a yoke is additionally provided on the base plate, serving as the yoke, to form a double yoke structure, or the yoke is attached to the base plate. Therefore, the thickness of portions other than the permanent magnet, that is, the thickness of the yoke and the base plate is increased, and the thickness of the detachable magnet unit is also increased. When the thickness of the detachable magnet unit is increased, the overall size and weight of the magnetron sputtering system are increased.

In addition, the permanent magnet provided in the magnet unit is formed of a relatively soft material. Therefore, when the permanent magnet is attached to or detached from the base plate, strong force is applied to the permanent magnet and the permanent magnet may be damaged.

Therefore, a detachable magnet unit including a yoke member with a minimum thickness is needed.

SUMMARY

According to an aspect of an embodiment, a magnet unit for a magnetron sputtering system includes a base plate and a plurality of magnet parts each including a first magnet and a first supporting member, the first supporting member supporting the first magnet and fixing the first magnet to the base plate, the magnet parts confining a plasma.

Additional objects and advantages of the invention will be set forth in part in the description which follows and, in part will be obvious from the description, or may be learned by practice of the present invention. The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF THE PREFERRED EMBODIMENTS

Hereinafter, an example of a magnetron sputtering system according to an embodiment of the invention will be described with reference to FIG. 1.

Figure 1:
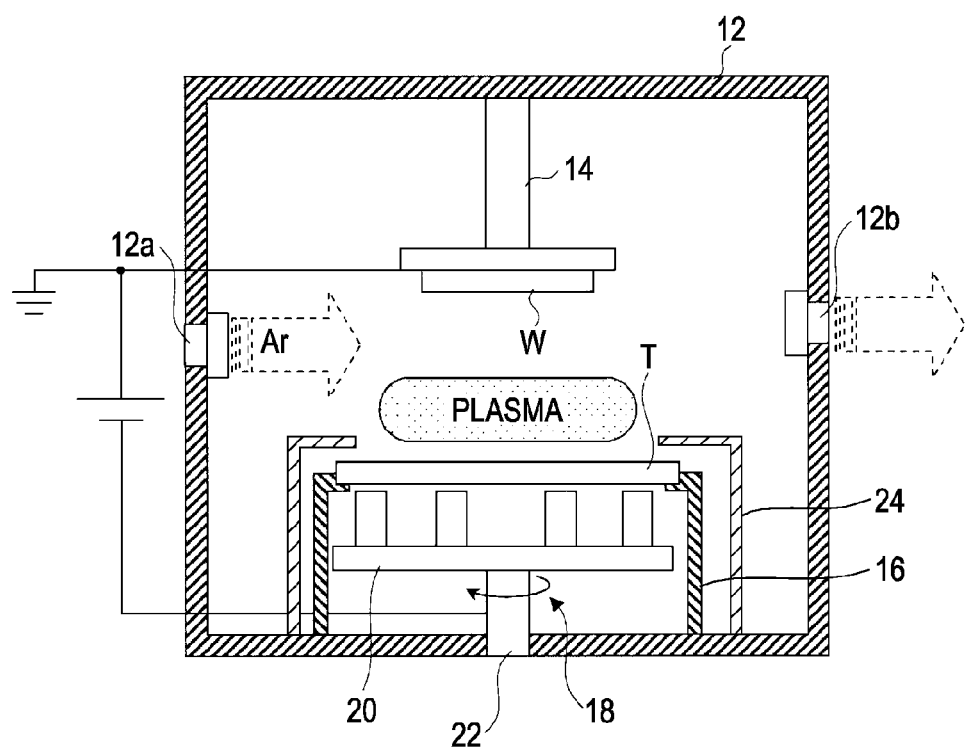
FIG. 1 is a diagram schematically illustrating the overall structure of a magnetron sputtering system according to the first embodiment.

A magnetron sputtering system shown in FIG. 1 sputters a target T, which is a deposition target, in a vacuum chamber 12 to form a film on a substrate W. A substrate holder 14 is provided at an upper part in the vacuum chamber 12, and the substrate W is mounted to the substrate holder 14. A target holder 16 is provided below the substrate holder 14, and the target T is mounted to the target holder 16.

A magnetron cathode 18 is provided on the rear side of the target T mounted to the target holder 16. The magnetron cathode 18 includes a magnet unit 20 that generates a magnetic field and a rotating mechanism 22 that rotates the magnet unit 20. Almost all parts of the target holder 16 and the magnetron cathode 18 except for a portion facing the substrate W are covered by a shield 24.

In the above-mentioned structure, the vacuum chamber 12, substrate holder 14 (substrate W), and the shield 24 are connected to the ground. A power source applies a voltage of several hundred volts to the magnetron cathode 18. In general, in a sputtering method, an inert gas, such as argon (Ar), is used to generate plasma. The inert gas is supplied into the vacuum chamber 12 through a gas inlet 12a, and discharged from an exhaust port 12b.

A magnet unit (see FIG. 2), which is also called a magnetic circuit, is incorporated into the magnetron cathode 18. When a high voltage is applied to the magnetron cathode 18, Ar in the vacuum chamber 12 is changed into plasma, and the plasma is confined in the vicinity of the front surface of the target T by the magnetic field generated by the magnet unit 20. Electrons in the plasma collide with Ar atoms by the voltage applied to the magnetron cathode 18 to generate Ar ions (Ar+). The Ar ions (Ar+) are accelerated by a sheath electric field generated between the plasma and the target T and collide with the target T. In this way, the target T is sputtered, and the sputtered target material is deposited on the substrate W held by the substrate holder 14.

Figure 2:
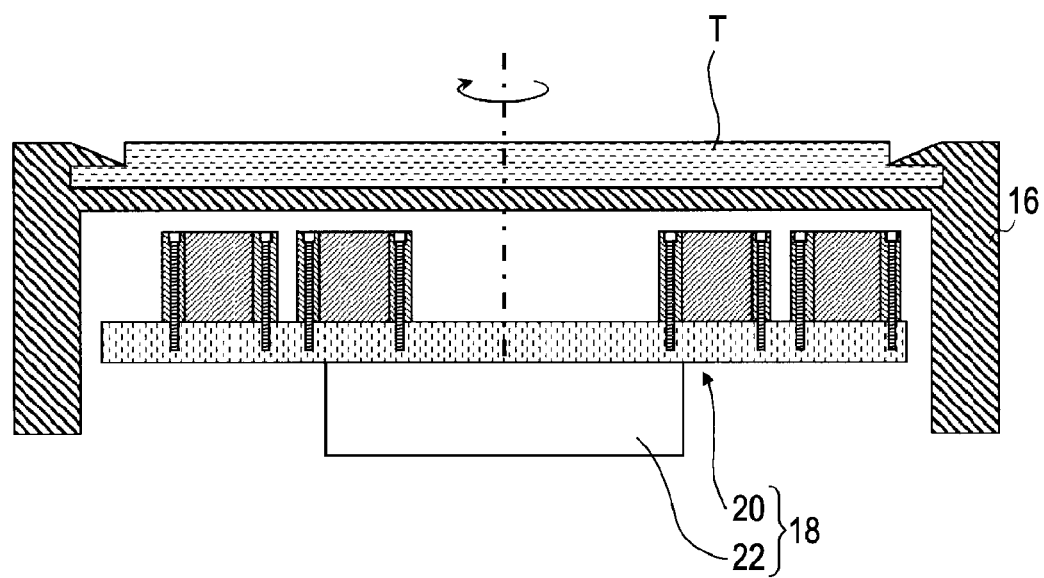
FIG. 2 is an enlarged cross-sectional view illustrating a magnetron cathode according to the first embodiment.

FIG. 2 is an enlarged cross-sectional view illustrating the target holder 16 and the magnetron cathode 18. The magnet unit 20 according to a first embodiment is incorporated into the magnetron cathode 18 shown in FIG. 2. The target holder 16 is provided so as to cover the magnet unit 20, and the target T is mounted to the target holder 16 so as to be arranged around an upper part of the magnet unit 20.

The magnetron cathode 18 includes the magnet unit 20 and the rotating mechanism 22 that rotates the magnet unit 20. The magnet unit 20 includes a plurality of magnet parts 30 and a base plate 32. The magnet parts 30 are fixed to the base plate 32 while being arranged in a predetermined pattern.

Figure 3:
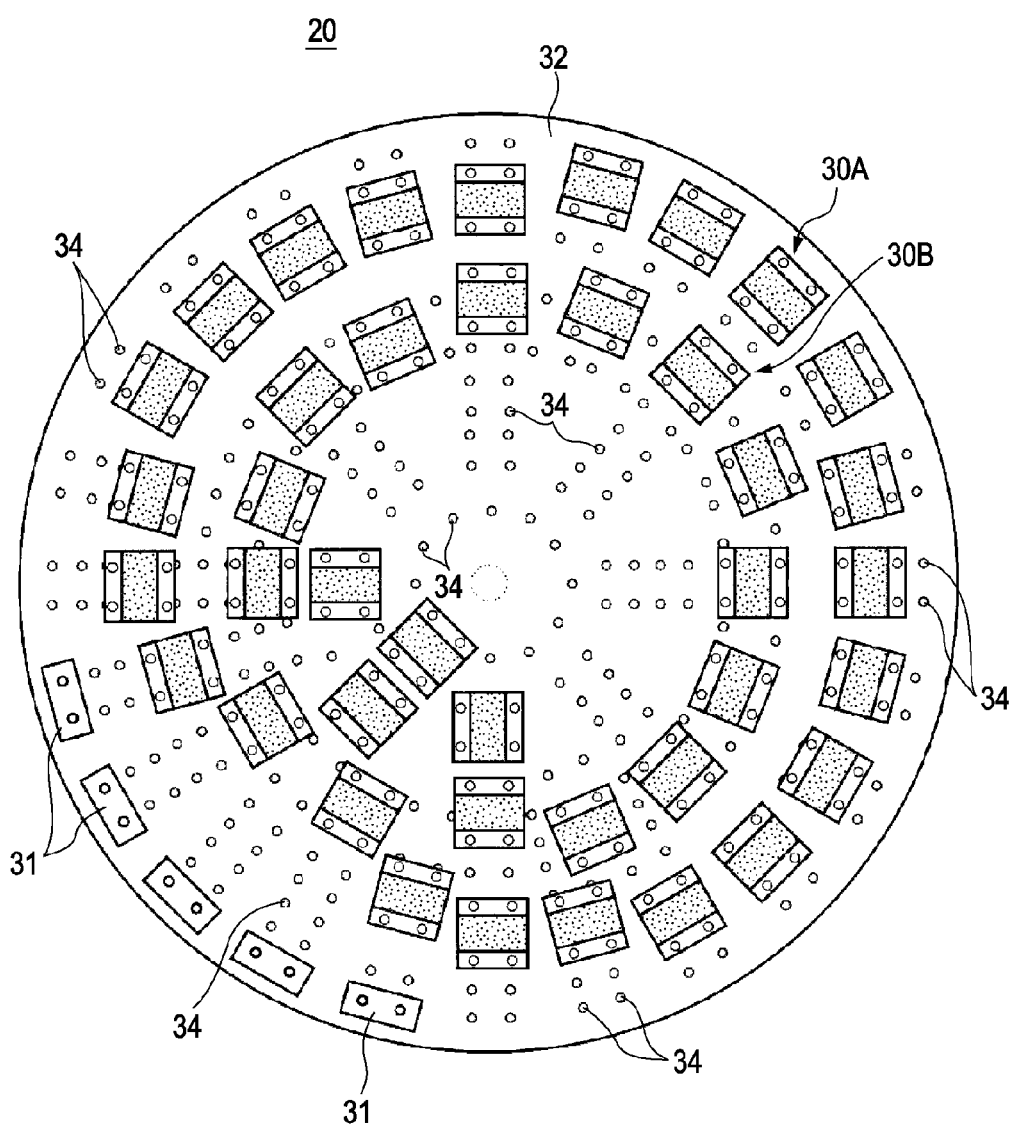
FIG. 3 is a plan view illustrating a magnet unit according to the first embodiment.

FIG. 3 is a plan view illustrating the magnet unit 20. Among the magnet parts 30 arranged in a predetermined pattern, for example, the outer magnet parts 30A are fixed to the base plate 32 such that their upper surfaces are magnetized to the N-pole, and the inner magnet parts 30B are fixed to the base plate 32 such that their upper surfaces are magnetized to the S-pole. The outer magnet parts 30A (N-pole) and the inner magnet parts 30B (S-pole) are arranged adjacent to each other such that leakage flux is emitted upward from the upper surface of the outer magnet part 30A (N-pole) and then bent 180 degrees to enter the inner magnet part 30B (S-pole). The lower surfaces of the magnet parts 30A and 30B come into contact with the base plate 32, serving as a yoke, and the magnetic flux from the magnet part 30B passes through the base plate 32 to enter the magnet part 30A. Therefore, closed magnetic flux lines passing through the magnet parts 30A and 30B are generated.

A portion of the leakage flux generated from the upper surfaces of the magnet parts 30A and 30B passes through the target T provided above the magnet unit 20 and is then emitted from target T upward. The magnetic flux causes plasma to be confined in the vicinity of the surface of the target T. As a result, sputtering is performed.

The polarity of the upper surface of the magnet part 30 and the arrangement pattern of the magnet parts 30 depend on the sputtering conditions or the kind of target T. In addition, the arrangement pattern of the magnet parts 30 depends on the thickness of the target T or the shape of the surface of the target T. That is, the arrangement pattern of the magnet parts 30 such that the leakage flux generated around the surface of the target T is most suitable for the process conditions is changed.

In this embodiment, the magnet part 30 is fixed to the base plate 32 by screws. A plurality of screw holes 34 are formed in the base plate 32, and the screw holes 34 are used to fix the magnet parts 30 to the base plate 32. Each of the magnet parts 30 has through holes 30a (FIG. 4) formed at predetermined positions, and the screw holes 34 are formed at positions corresponding to the through holes 30a. That is, among a plurality of screw holes 34, some screw holes 34 (four screw holes 34 in example shown in FIG. 3) provided in a region for fixing one magnet part 30 are selected, and the selected screw holes 34 are used to fix the magnet part 30 to the base plate 32.

A plurality of screw holes 34 are provided in the entire surface of the base plate 32, and it is possible to select four screw holes 34 corresponding to four through holes 30a of the magnet part 30 at any position. Therefore, it is possible to fix the magnet part 30 at a desired position or in the vicinity of the desired position by selecting one of a plurality of positions capable of fixing the magnet parts 30 to the base plate 32. In this way, it is possible to select positions for fixing a plurality of magnet parts 30 to the base plate. As a result, it is possible to arrange the magnet parts 30 in a desired pattern.

The magnet unit 20 is rotated about the center of the base plate 32. Therefore, in order to smoothly rotate the magnet unit 20, it is preferable to align the center of gravity of the magnet unit 20 with the center of the base plate 32 to obtain a good rotation balance. In the example shown in FIG. 3, balance weights 31 are attached to the base plate 32 to align the position of the center of gravity of the magnet unit 20 with the center of rotation thereof. In this case, the screw holes 34 can be used to screw the balance weights 31 to the base plate.

Figure 4:
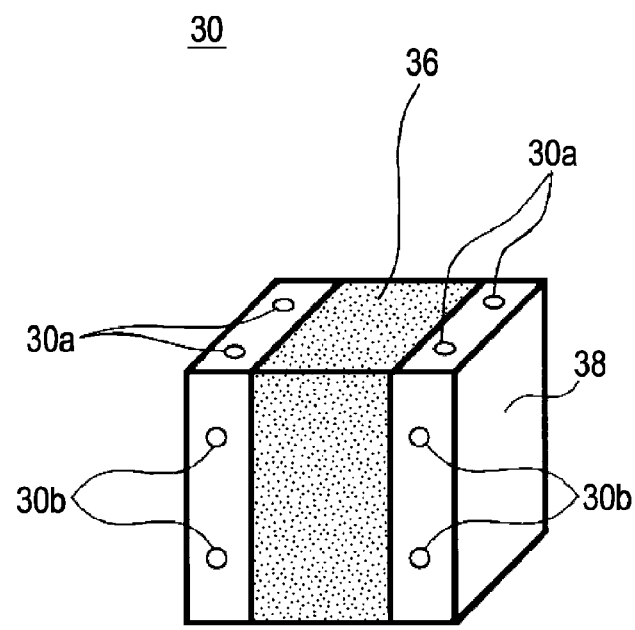
FIG. 4 is a perspective view illustrating a magnet part.

FIG. 4 is a perspective view illustrating the magnet part 30. The magnet part 30 according to this embodiment includes a permanent magnet 36 and supporting members 38 that are formed of a non-magnetic material, such as stainless steel. The supporting member 38 is a plate member that is formed of a non-magnetic material. The shape of the surface of the supporting member 38 is substantially the same as that of the side surface of the permanent magnet 36, and the supporting members 38 are attached to the side surfaces (surfaces orthogonal to the surfaces serving as the N-pole and the S-pole) of the permanent magnet 36. It is preferable to fix the supporting members 38 to the permanent magnet 36 by an adhesive. However, other fixing methods may be used. Since the permanent magnet 36 is formed of a relatively soft material, it is preferable to use a method of fixing the supporting members 38 to the permanent magnet 36 without punching the permanent magnet 36. The supporting members 38 are fixed to the permanent magnet 36 by an adhesive to form the magnet part 30.

The screw through holes 30a are formed in the supporting members 38. Since the permanent magnet 36 is formed of a relatively soft material, it is difficult to process the permanent magnet 36. Therefore, the through holes 30a are formed in the supporting members 38, and the supporting members 38 having the through holes 30a formed therein are fixed to the permanent magnet 36 by an adhesive.

In the example shown in FIG. 4, the supporting members 38 are fixed to both sides of the permanent magnet 36. However, the supporting member 36 may be fixed to only one side surface of the permanent magnet 36 as long as it can be reliably fixed to the permanent magnet 36.

Figure 5:
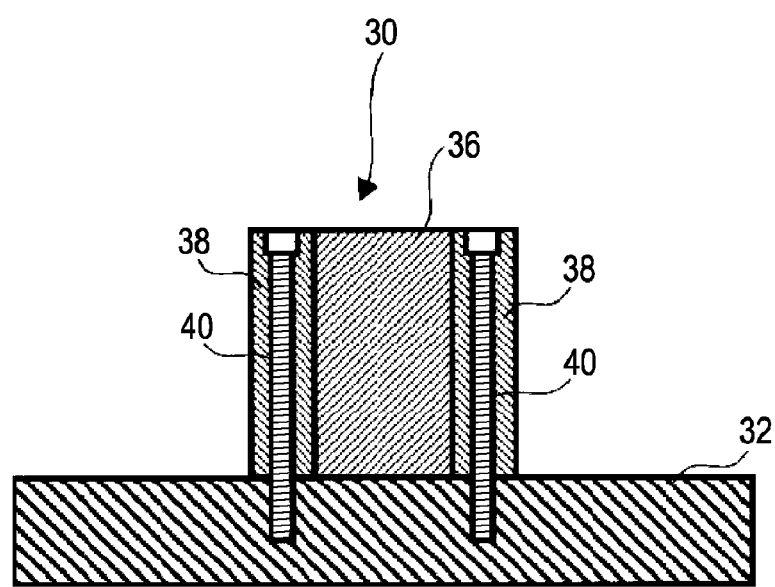
FIG. 5 is a cross-sectional view illustrating the magnet part screwed to a base plate.

FIG. 5 is a cross-sectional view illustrating the magnet part 30 screwed to the base plate 32. The screws 40 are inserted into the through holes 30a to be engaged with the screw holes 34 of the base plate 32, thereby fixing the magnet part 30 to the base plate 32. The screw 40 is formed of a non-magnetic material, such as stainless steel, similar to the supporting member.

The target T is provided above the magnet part 30 so as to be adjacent to the magnet part 30. Therefore, it is preferable that a hexagon socket head bolt be used as the screw 40 so that the socket head of the screw 40 does not protrude from the magnet part 30 and strong tightening force is obtained.

In the example shown in FIG. 5, the screw hole 34 engaged with the screw 40 does not pass through the base plate 32. However, the screw hole 34 may be formed so as to pass through the base plate. On the contrary to the example shown in FIG. 5, instead of the through holes 30a, the screw holes may be formed in the supporting member 38, and, instead of the screw holes 34, the through holes may be formed in the base plate 32. That is, the screws may be inserted into the through holes formed in the base plate 32 from the rear side to be engaged with the screw holes formed in the supporting member 38, thereby fixing the magnet part 30 to the base plate 32. However, as in the example shown in FIG. 5, it is preferable to insert the screws 40 from the upper side of the magnet part 30. In this case, it is possible to easily position the magnet part 30 and easily tighten the screw 40 while viewing the magnet part 30. When the screw is inserted from the rear side of the base plate 32, the operator tightens the screw from the rear side while viewing the front side of the magnet part 30. As a result, it is difficult to tighten the screw.

Figure 6:
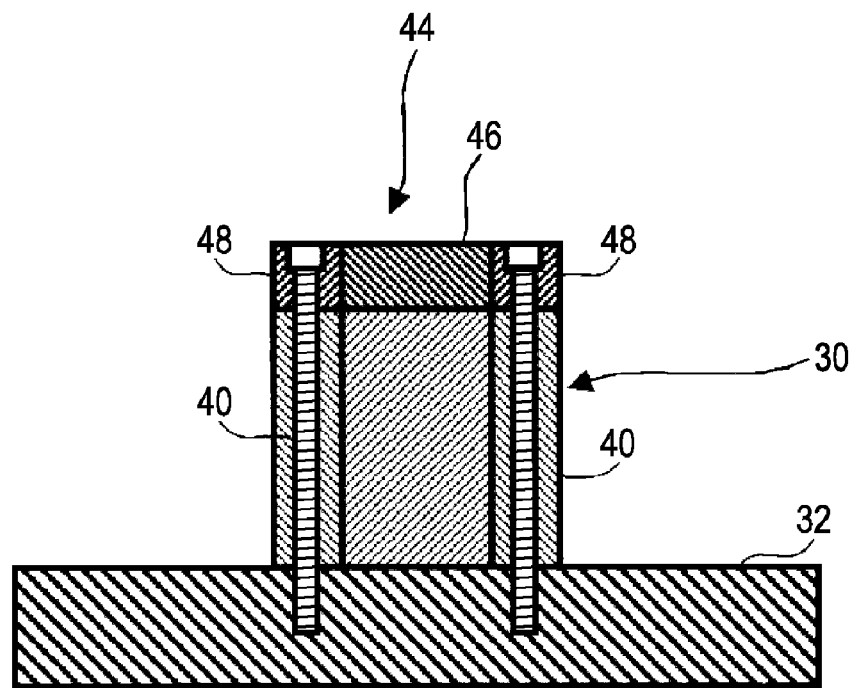
FIG. 6 is a cross-sectional view illustrating another magnet part screwed on the magnet part.

As in the example shown in FIG. 5, when the screw 40 is inserted from the upper side of the magnet part 30, as shown in FIG. 6, it is possible to fix another magnet part 44 onto the magnet part 30 by the screws 40. Similar to the magnet part 30, the magnet part 44 is formed by fixing supporting members 48 to the side surfaces of the permanent magnet 46 by an adhesive. The magnet part 44 provided on the magnet part 30 makes it possible to increase the density of leakage flux generated from the magnet and to adjust a magnetic field for confining plasma.

Figure 7:
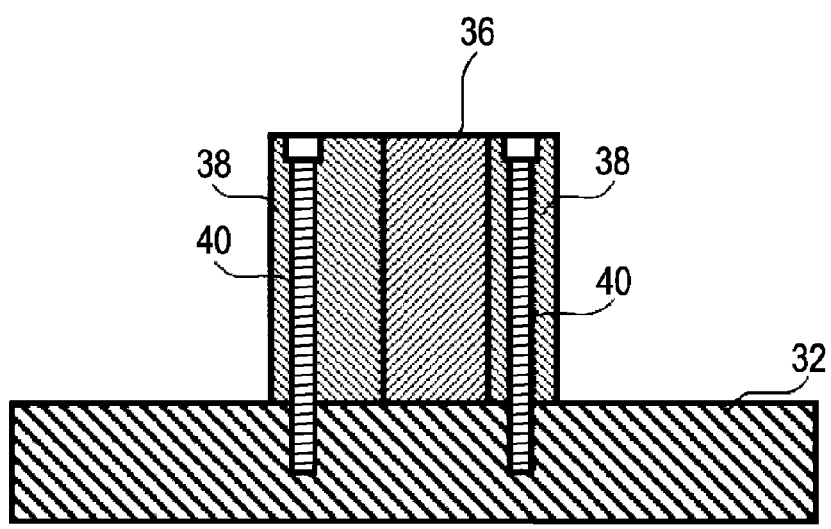
FIG. 7 is a cross-sectional view illustrating a magnet part having supporting members with different thicknesses on both side screwed to the base plate.

As a modification of the magnet part 30 shown in FIG. 5, supporting members 38A and 38B having different thicknesses may be fixed to both side surfaces of the permanent magnet 36, as shown in FIG. 7. In this case, it is possible to change the position of the permanent magnet 36 only by rotating the magnet part 30 180 degrees horizontally and fixing the magnet part 30.

The magnet part 30 shown in FIG. 4 includes through holes 30b in addition to the through holes 30a. The through hole 30b extends in a direction that is vertical to the extension direction of the through hole 30a. The arrangement of the through holes 30b is the same as that of the through holes 30a. Therefore, it is possible to rotate the magnet part 30 90 degrees and fix the magnet part 30 to the base plate 32 by the screws 40, as shown in FIG. 5. In this way, it is possible to change the direction of the permanent magnet 36 and change the magnetic field generated by the magnet part 30.

Next, a magnet unit according to a second embodiment is described with reference to FIGS. 8 to 11. Similar to the magnet unit according to the first embodiment, in the magnet unit according to the second embodiment, a plurality of screw holes are formed in a base plate. Therefore, it is possible to change the fixing position of the magnet part.

Figure 8:
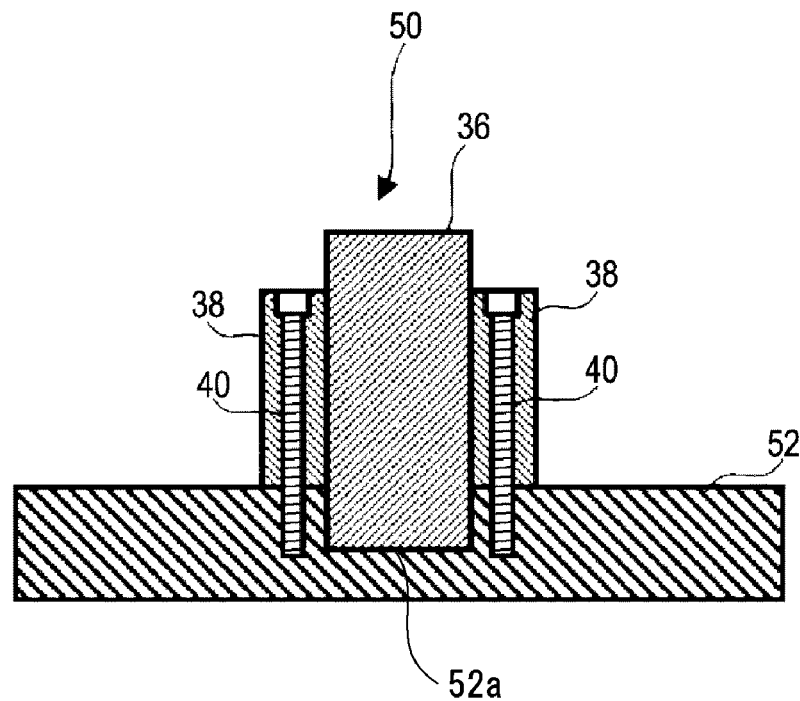
FIG. 8 is a cross-sectional view illustrating a part of a magnet unit according to a second embodiment.

As shown in FIG. 8, the magnet unit according to the second embodiment includes a magnet part 50 formed by fixing supporting members 38, each having a size that is smaller than that of a permanent magnet 36, to the permanent magnet 36, and a base plate 52 having a magnet accommodating groove 52a provided therein. That is, the upper and lower parts of the permanent magnet 36 protrude from the upper and lower surfaces of the supporting members 38, respectively. Therefore, the lower part of the permanent magnet 36 protruding from the supporting members 38 is accommodated or fitted into the magnet accommodating groove 52a formed in the base plate 52. In this state, the magnet part 50 is screwed to the base plate 52.

Figure 9:
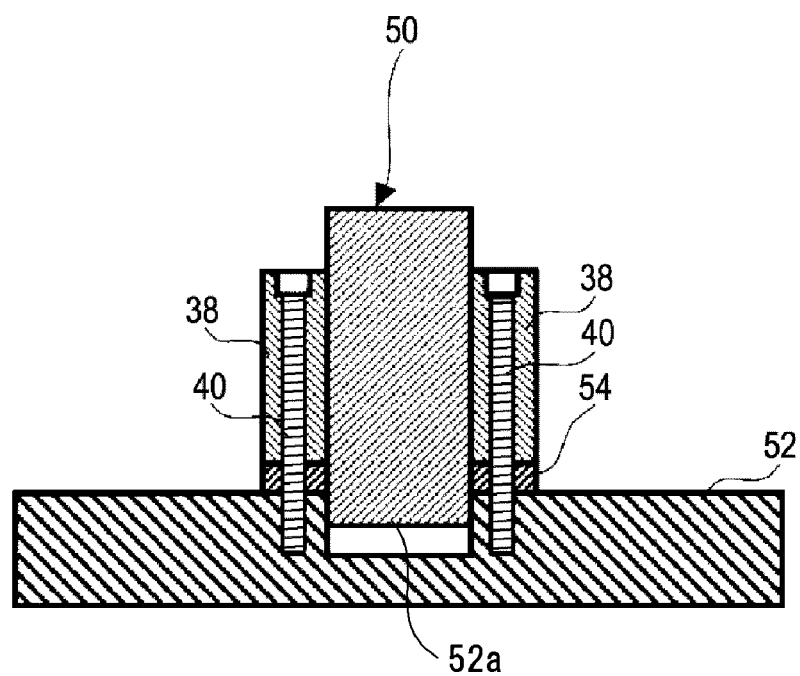
FIG. 9 is a cross-sectional view illustrating a height adjusting member additionally provided in the structure shown in FIG. 8.
Figure 10:
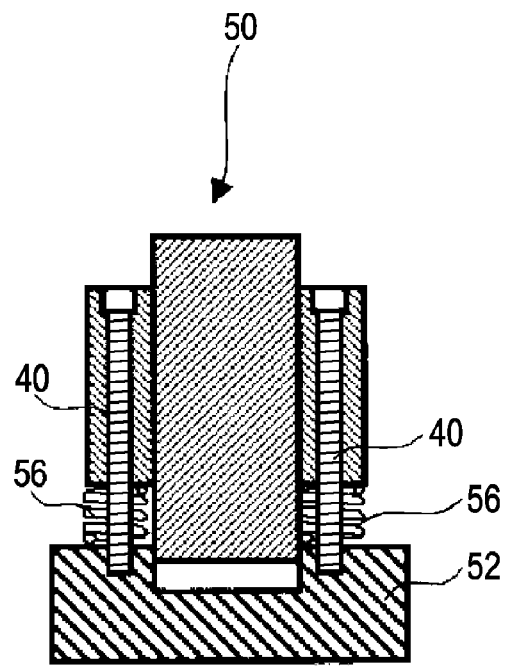
FIG. 10 is a cross-sectional view illustrating an example in which a coil spring is used instead of the height adjusting member.
Figure 11:
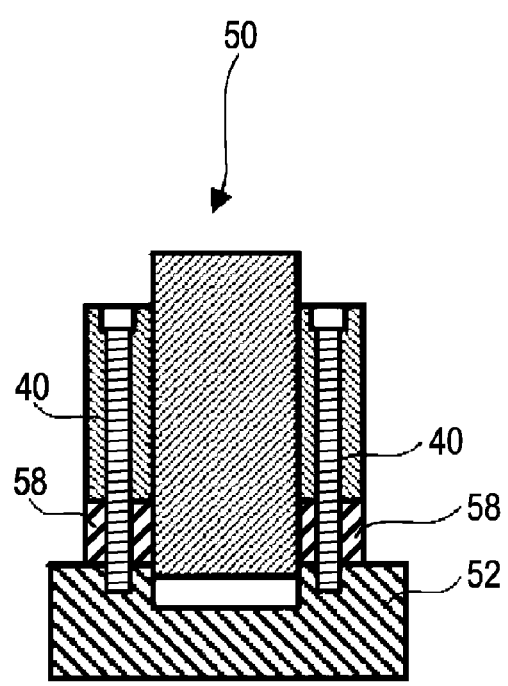
FIG. 11 is a cross-sectional view illustrating an example in which a rubber member is used instead of the height adjusting member.

In the structure shown in FIG. 9, it is possible to easily adjust the height of the magnet part 50 (the height of the upper surface of the permanent magnet 36 from the base plate 52) using a height adjusting member 54, as shown in FIG. 9. The height adjusting member 54 is formed of a non-magnetic material, similar to the supporting member 38. It is possible to increase the height of the upper surface (the surface serving as the N-pole or the S-pole) of the permanent magnet 36 by a value corresponding to the thickness of the height adjusting member 54 by inserting the height adjusting member 54 having a thickness corresponding to a desired height between the supporting member 38 and the base plate 52 and fixing it by screws.

The depth of the magnet accommodating groove 52a provided in the base plate 52 is set to be sufficiently larger than the thickness of the height adjusting member 54. Therefore, even when the height adjusting member 54 is additionally provided, a portion of the permanent magnet 36 is fitted into the magnet accommodating groove 52a, and the permanent magnet 36 is connected to the base plate 52 without any gap therebetween. That is, the contact between the side surface of the permanent magnet 36 and the side wall of the magnet accommodating groove 52a is maintained. The magnetic flux of the permanent magnet 36 can enter the base plate 52 through the contact portion. Therefore, it is possible to reduce magnetic resistance, as compared to the case when the magnetic flux passes through a gap. As a result, even when the height adjusting member 54 is additionally provided, the magnetic flux density of the permanent magnet 36 is not greatly reduced.

Instead of additionally providing the height adjusting member 54, the supporting members 38 may be fixed to the base plate 52 by the screws 40 with elastic members interposed therebetween. In the example shown in FIG. 10, as the elastic member, a coil spring 56 is interposed between the supporting member 38 and the base plate 52. In the example shown in FIG. 11, as the elastic member, a rubber member 58 is interposed between the supporting member 38 and the base plate 52.

The magnet part 50 is fixed to the base plate 52 with the elastic member, such as the coil spring 56 or the rubber member 58 elastically deformed. Therefore, when the screw 40 is loosened, the magnet part 50 is moved up. When the screw 40 is tightened, the magnet part 50 is moved down. In this way, it is possible to arbitrarily adjust the height of the magnet part 50, that is, the height of the upper surface (the surface serving as the N-pole or the S-pole) of the permanent magnet 36.

Figure 12:
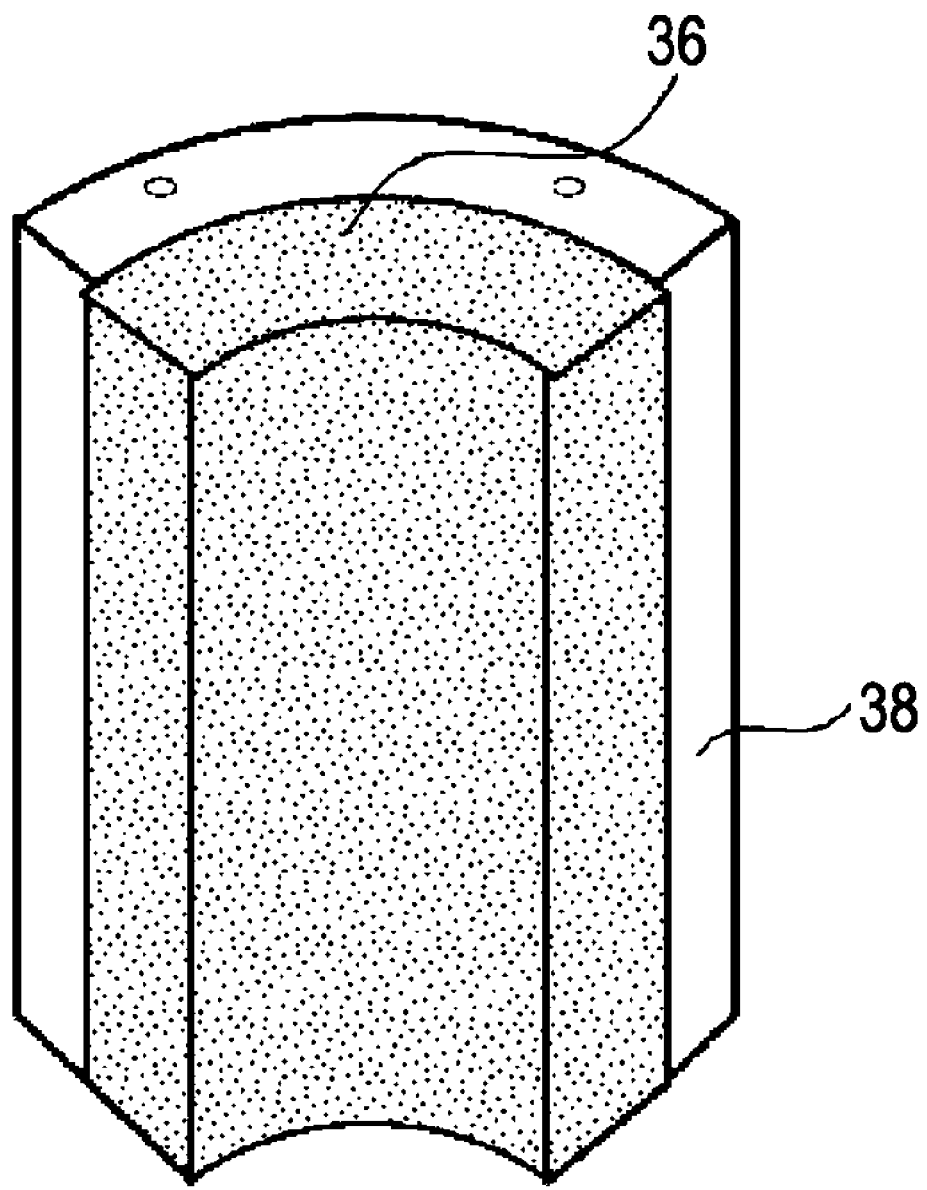
FIG. 12 is a perspective view illustrating a magnet part using an arc-shaped permanent magnet.

In the first and second embodiments, the permanent magnet 36 has a rectangular parallelepiped shape. However, the shape of the permanent magnet 36 is not limited to the rectangular parallelepiped. For example, as shown in FIG. 12, the permanent magnet 36 may have an arc shape. In this case, the supporting member 38 also has an arc shape corresponding to the shape of the permanent magnet. In addition, in the magnet part shown in FIG. 12, the supporting member 38 is fixed to only one side of the arc-shaped permanent magnet 36.

As described above, when the magnet units according to the first and second embodiments are used, it is possible to easily adjust the position of the magnet part in both the horizontal and vertical directions and easily generate a magnetic field having a desired shape and intensity. In addition, it is possible to firmly fix the permanent magnet to the base plate without processing the permanent magnet.

Next, a method of attaching or detaching the magnet unit is described with reference to FIG. 13.

The permanent magnet 36 of the magnet part 30 generates a very strong magnetic force. Since the base plate 32 serves as a yoke through which the magnetic flux passes, the magnet part 30 is strongly attracted to the base plate 32. Therefore, when the magnet part 30 is manually detached from the base plate 32, the magnet part 30 is attracted to the base plate 32 and is likely to diagonally collide with the base plate 32. When the magnet part 30 is attached to the base plate 32, the magnet part 30 is likely to fall on the base plate 32 with a thud. In this case, the permanent magnet 36 made of a relatively soft material is likely to be damaged due to an impact caused by collision or falling. Once the magnet part 30 is loaded on the base plate 32, it is difficult to change the position of the magnet part 30 and align the through hole 30*a* with the screw hole 34.

Figure 13:
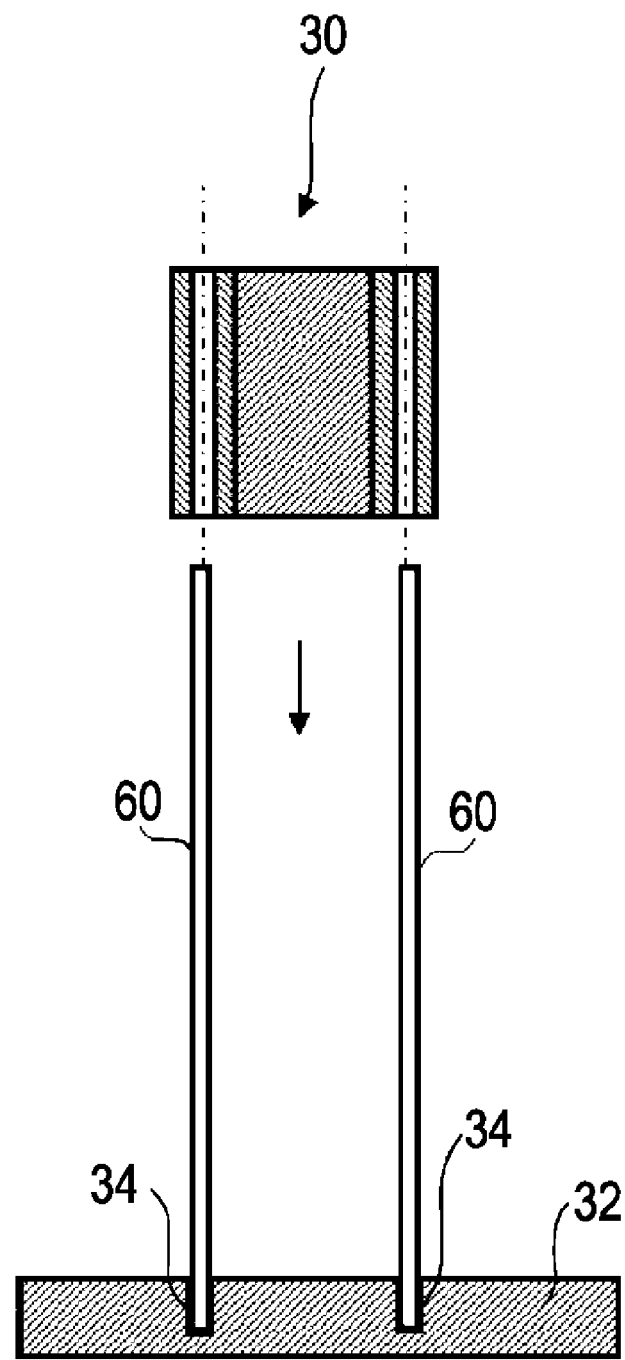
FIG. 13 is a diagram for explaining a magnet attaching/detaching method using guide pins.

Therefore, as shown in FIG. 13, guide pins 60 are inserted into the screw holes 34 of the base plate 32 in advance, and the magnet part 30 is loaded on the base plate 32 while inserting the guide pins 60 into the through holes of the magnet part 30. According to this magnet attaching method, the movement of the magnet part 30 is guided by the guide pins 60. Therefore, the operator does not need to give attention to attaching the magnet part 30 so as not to be inclined and can pay attention to other things. Therefore, it is possible to prevent the magnet part 30 from falling from the hand of the operator and strongly colliding with the base plate 32 immediately before the magnet part 30 is loaded on the base plate 32.

Further, since the through holes 30*a* of the loaded magnet part 30 are guided by the guide pins 60, they are accurately aligned with the screw holes 34. Therefore, positioning is automatically performed, and it is possible to easily position the magnet part 30 in a short time.

When the magnet part 30 is detached from the base plate 32, the screws 40 are loosened, and the magnet part is lifted up along the guide pins 60 inserted into the through holes 30*a* and the screw holes 34.

As described above, according to the magnet parts of the first and second embodiments, it is possible to achieve a method of easily attaching or detaching the magnet part in a short time.

Further, it is possible to fix the magnet part at a different position by selecting some of a plurality of screw holes formed in the entire surface of the base plate and fixing the magnet part to the base plate by screws. Therefore, it is possible to change the arrangement pattern of the magnet parts without replacing the base plate.

The order of the embodiments is not meant to show the superiority of any embodiments over any other embodiments. Although the embodiments of the present inventions have been described in detail, it should be understood that the various changes, substitutions, and alterations could be made hereto without departing from the spirit and scope of the invention.

What is claimed is:

1. A magnet unit for a magnetron sputtering system, comprising:
    a base plate; and
    a plurality of magnet parts each including a first magnet and a first supporting member, the first supporting member supporting the first magnet and fixing the first magnet directly to the base plate, the magnet parts confining a plasma.

2. The magnet unit according to claim 1, wherein a contact surface between the first magnet and the first supporting member is orthogonal to surfaces serving as the N-pole of the first magnet and the S-pole of the first magnet.

3. The magnet unit according to claim 1, wherein the first supporting member is made of a non-magnetic material.

4. The magnet unit according to claim 1, wherein the first supporting member includes a hole, and the hole and a screw fix the magnet part on the base plate.

5. The magnet unit according to claim 1, the magnet part includes a second supporting member fixing the base plate, and the first supporting member and the second supporting member have different thicknesses.

6. The magnet unit according to claim 1, the magnet part includes a second magnet in contact with a first magnet.

7. The magnet unit according to claim 1, further comprising:
    a height adjusting member between the base plate and the supporting member.

8. The magnet unit according to claim 1, further comprising:
    a elastic member between the base plate and the supporting member.

9. A magnetron sputtering system, comprising:
    a vacuum chamber;
    a base plate;
    a plurality of magnet parts each including a first magnet and a first supporting member, the first supporting member supporting the first magnet and fixing the first magnet directly to the base plate, the magnet parts confining a plasma; and
    a rotating mechanism rotating the base plate to the vacuum chamber.

10. A method for installing a magnet part in a magnetron sputtering system, comprising:
    inserting guide pins into screw holes of a base plate to which the magnet part can be screwed;
    moving the magnet part along the guide pins into direct contact with the base plate and inserting the guide pins into through holes of the magnet part, thereby aligning the magnet part with the base plate;
    removing the guide pins;
    inserting screws through the holes of the magnet part and securing the screws in the base plate.

* * * * *